(12) United States Patent
Kelkar et al.

(10) Patent No.: US 7,241,643 B1
(45) Date of Patent: Jul. 10, 2007

(54) WAFER LEVEL CHIP SCALE PACKAGE

(75) Inventors: Nikhil Vishwanath Kelkar, San Jose, CA (US); Hem P. Takiar, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 171 days.

(21) Appl. No.: 11/126,461

(22) Filed: May 10, 2005

Related U.S. Application Data

(62) Division of application No. 09/653,925, filed on Sep. 1, 2000, now Pat. No. 6,900,532.

(51) Int. Cl.
*H01L 21/00* (2006.01)
*H01L 21/44* (2006.01)

(52) U.S. Cl. ............... 438/113; 438/106; 438/107; 438/108; 438/110; 438/114; 438/612; 438/613; 438/614; 438/617; 438/584

(58) Field of Classification Search ............ None
See application file for complete search history.

(56) References Cited

U.S. PATENT DOCUMENTS

| | | | |
|---|---|---|---|
| 5,300,402 A | 4/1994 | Card et al. | |
| 5,477,160 A | 12/1995 | Love | |
| 5,508,229 A | 4/1996 | Baker | |
| 5,518,964 A | 5/1996 | DiStefano et al. | |
| 5,677,576 A | 10/1997 | Akagawa | |
| 5,691,041 A | 11/1997 | Frankeny et al. | |
| 5,834,844 A | 11/1998 | Akagawa et al. | |
| 5,892,271 A | 4/1999 | Takeda et al. | |
| 5,915,170 A | 6/1999 | Raab et al. | |
| 5,933,712 A | 8/1999 | Bernhardt et al. | |
| 5,936,843 A | 8/1999 | Ohshima et al. | |
| 5,990,546 A | 11/1999 | Igarashi et al. | |
| 6,002,168 A | 12/1999 | Bellaar et al. | |
| 6,020,220 A | 2/2000 | Gilleo et al. | |
| 6,077,757 A | 6/2000 | Mizuno et al. | |
| 6,081,026 A | 6/2000 | Wang et al. | |
| 6,323,058 B1 | 11/2001 | Murakamz et al. | |

*Primary Examiner*—Jasmine Clark
(74) *Attorney, Agent, or Firm*—Beyer Weaver LLP

(57) ABSTRACT

A wafer level fabricated integrated circuit package having an air gap formed between the integrated circuit die of the package and a flexible circuit film located over and conductively attached to the die though raised interconnects formed on the die is described. The flexible circuit film further includes routing conductors that connect inner landings on the bottom surface of the flexible circuit film with outer landings on the top surface of the flexible circuit film. The outer landings are offset a horizontal distance from the inner landings. In some embodiments, contact bumps are formed on the outer landings of the flexible circuit film layer for use in connecting the package to other substrates. The wafer level chip scale package provides a highly compliant connection between the die and any other substrate that the die is attached to.

15 Claims, 9 Drawing Sheets

WAFER LEVEL CHIP SCALE PACKAGE

CROSS-REFERENCE TO RELATED APPLICATIONS

This application is a Divisional of U.S. patent application Ser. No. 09/653,925, filed on Sep. 1, 2000 now U.S. Pat. No. 6,900,532, the contents of which is hereby incorporated by reference.

FIELD OF THE INVENTION

The present invention relates generally to integrated circuit packages. More specifically, the present invention relates to miniature chip scale packages manufactured in wafer form and improved package structures.

BACKGROUND OF THE INVENTION

With current emphasis on increased circuit density and decreased integrated circuit package footprints, process engineers attempt to design increasingly smaller and more dense integrated circuit packages. A current outgrowth of this emphasis is the chip scale package. Typically, a chip scale package has an overall package dimension that is relatively close to that of the integrated circuit die, or chip, that is enclosed within the package. Generally, chip scale packages are manufactured either using individual chips that have been singulated from a wafer, or in wafer form and then the individual chip scale packages are singulated from the wafer. The latter type of chip scale package is referred to as a wafer level chip scale package.

One example of a wafer level chip scale package is a surface mount die, such as a flip chip package. Surface mount dice typically have input/output contacts, such as solder bumps, that are located on the active side of the die.

FIG. 1A is a diagrammatic side view of a conventional flip chip package. Typically, the flip chip package 100 includes a die 102 having a plurality of conventionally fabricated integrated circuit structures, such as transistors, etc. (not shown). The top surface of the die 102 includes contact pads 104 which provide for conductive interconnection to the integrated circuit structures of the die 102. Contact bumps 106, such as solder bumps, are conventionally formed on the contact pads 104 to allow for interconnection of the package to other substrates. The bottom surface of the die 102 is conventionally left bare. Typically, a plurality of flip chip packages 100 are formed on the surface of an integrated circuit wafer (not shown). After fabrication of the flip chip packages, the wafer is singulated into individual flip chip packages 100, for example, by laser cutting or sawing. The individual flip chips may then be inverted and attached to a substrate, such as a printed circuit board.

In attaching the flip chip to the substrate, the contact bumps are typically aligned and electrically coupled to an associated board contact of the substrate, for example, by a reflow process, which forms a solder joint. In this way, a high density of input/output pads are provided within a small package footprint as the contact pads are over the die itself. A disadvantage of this design is that stresses introduced on the contact bumps may damage the flip chip package.

FIG. 1B is a diagrammatic side view of a conventional flip chip package attached to a substrate. Typically, the die 102 of the flip chip package 100 and the substrate 110 are formed from different materials that may have substantially different coefficients of thermal expansion. When the flip chip contact bumps 106 are attached to the contact pads 108 of the substrate 110 and power is applied, the resultant heat dissipates in the die 102 and the substrate 110 causing each to expand and contract in different amounts. This causes the contact bumps 106, which are on the contact pads 104 of the die 102, to move relative to the contact pads 108 of the substrate 110.

As the solder joint in this design is a relatively rigid joint structure, the relative movement can deform and stress the contact bumps 106 and may ultimately result in damage to the flip chip package 100, for example, solder joint fatigue. Further, the stresses on the contact bumps 106 may push the contact bumps 106 into the underlying layers that form the die 102 and cause craters within the die 102. Additionally, the stresses may cause the contact bumps 106 to tear open.

To mitigate the effects of the stresses, an underfill layer 112 is typically injected between the substrate 110 and the flip chip package 100 and around the contact bumps 106 of the flip chip package 100. The underfill layer 112 helps to reduce the stress effects of the differential thermal expansion between the die 102 and the substrate 110 and to improve the reliability of the package. However, the addition of the underfill layer 112 results in an extra processing step and increased associated costs, thus impacting overall production costs and production yield. Additionally, as the contact bumps 106 and underfill layer 112 are rigidly attached to the die 102, the package 100 still retains some stress-related problems which can be transferred to and damage the die 102.

Further, the design of the package 100 restrains both the arrangement of the contact bumps 106 and the arrangement of the contact pads 108 of a substrate to the arrangement of the contact pads 104 on the die 102. Thus, this design tends to limit the packaging to use with smaller die sizes/pin counts, for example, 3×3 mm size/28–40 leads.

In an attempt to relieve the contact restraints, another design, further described in U.S. Pat. No. 5,990,546 to Igarashi et al., utilizes an auxiliary wiring plate over the die on which external contacts for connecting to a substrate can be formed and surrounds the die and the space between the die and the auxiliary wiring plate with a resin. The auxiliary wiring plate may have contacts differently located on each side to provide more flexibility in locating the external contacts. This package, however, is not manufactured at the wafer level, and instead, the package is formed using individual chips singulated from a wafer.

FIG. 2 is a diagrammatic side view of an example of a semiconductor package 200 utilizing an auxiliary wiring plate with external contacts formed on the wiring plate and resin interposed between the wiring plate and the die. The semiconductor package 200 includes an integrated circuit die 202, an auxiliary wiring plate 204, and a resin layer 206 sealing the space between the die 202 and the auxiliary wiring plate 204. The die 202 typically includes a plurality of conventionally fabricated integrated circuit structures. The top surface of the die 202 includes contacts 208, which provide interconnection to the integrated circuit structures of the die 202. The auxiliary wiring plate 204 includes an inner electrode 210 coupled with the contacts 208 of the die 202, an outer electrode 212 located at a different position from the back position of the inner electrode 210, a routing conductor 214 extended between both electrodes 210 and 212, and insulating layers 216 and 218 formed on both surfaces of the routing conductor 214.

According to one method, the package 200 can be made using the tape-automated bonding technique in which the auxiliary wiring plate 204, including the inner and outer electrodes 210 and 212 with routing conductors 214, is initially fabricated. Then the contacts 208 of the die 202 are connected to the inner electrode 210 and the insulating support film 216 and the die 202 are sealed with resin to form the package 200. The film carrier tape is then punched out to define the periphery of the die 202.

Another design, further described in U.S. Pat. No. 6,020,220 to Gilleo et al., attempts to mitigate the stresses received at the die by utilizing a less rigid underfill layer and a flexible wiring layer over the underfill layer on which external contacts for connecting to a substrate can be formed. The compliance in the interposer layer and in the conductive polymer are utilized to permit relative movement of the connections on the dielectric substrate wiring layer to the die contacts to mitigate the stress caused by differential thermal expansion. Again, however, this package is not manufactured at the wafer level, and instead, the package is formed using individual chips singulated from a wafer.

FIG. 3 is a diagrammatic side view of an example of a semiconductor package 300 utilizing a compliant interposer layer and flexible wiring layer. The semiconductor package 300 includes a die 302, a compliant interposer layer 304, and a dielectric substrate wiring layer 306. The die 302 typically includes a plurality of conventionally fabricated integrated circuit structures. The top surface of the die 302 includes contacts 308, which provide interconnection to the integrated circuit structures of the die 302. The compliant interposer layer 304 has conductive columns 310 that are aligned with and provide conductive interconnection to the contacts 308. The dielectric substrate wiring layer 306 is typically a flexible, film circuit element. The dielectric substrate wiring layer 306 has a bottom surface which includes bond pads 312 interconnected to bond pads 314 on the top surface on which conductive contacts 316, such as solder balls, may be formed to allow connection to another substrate, such as a printed circuit board. The dielectric substrate wiring layer 306 is attached to the compliant interposer layer 304 such that the bond pads 312 are aligned and attached with the corresponding conductive column 310. According to one method, the package is made on the dielectric substrate wiring layer 306 and then attached to the die 302 using heat and pressure.

Consequently, there is a need for a wafer level fabricated chip scale integrated circuit package design that can further decouple the stresses between the package and other substrates to which it is attached, and can provide flexibility in the arrangement of the package contacts to other substrates.

SUMMARY OF THE INVENTION

To achieve the foregoing, and in accordance with the purpose of the present invention, the present invention includes wafer level chip scale integrated circuit package devices and methods for forming wafer level chip scale integrated circuit packages which provide highly compliant interconnections between external substrates and the packaged integrated circuit die and, additionally, provide flexibility in locating the external contacts which may be connected to other substrates.

In one embodiment of the present invention, an integrated circuit package having a flexible circuit film and raised interconnects is described. The flexible circuit film is located over and conductively coupled to raised interconnects formed on at least some of the bond pads of the integrated circuit die such that an air gap is formed between the die and the flexible circuit film.

In another embodiment of the present invention, a wafer level method of packaging integrated circuits is described.

Raised interconnects are formed over and conductively coupled to bond pads on the various dice of the wafer. A flexible circuit film is applied over the raised interconnects and conductively attached to the raised interconnects such that an air gap is formed between the flexible circuit film and the integrated circuit wafer. The integrated circuit wafer is singulated into individual integrated circuit packages.

In another embodiment of the present invention, an integrated circuit wafer is described. The integrated circuit wafer includes a plurality of integrated circuit dice having a plurality of bond pads located on the top side of the integrated circuit wafer. A plurality of raised interconnects are located over and conductively coupled to the plurality of bond pads. A flexible circuit film is located over and conductively attached to the plurality of raised interconnects such that an air gap is formed between the integrated circuit wafer and the flexible circuit film.

BRIEF DESCRIPTION OF THE DRAWINGS

The present invention may best be understood by reference to the following description taken in conjunction with the accompanying drawings in which.

DETAILED DESCRIPTION OF THE INVENTION

Methods and apparatus for a wafer level chip scale integrated circuit package are described below. In the following description, numerous specific details are set forth in order to provide a thorough understanding of the present invention. It will be appreciated, however, to one skilled in the art, that the present invention may be practiced without some or all of these specific details. In other instances, well known process operations have not been described in detail in order not to unnecessarily obscure the present invention.

Figure 1A:
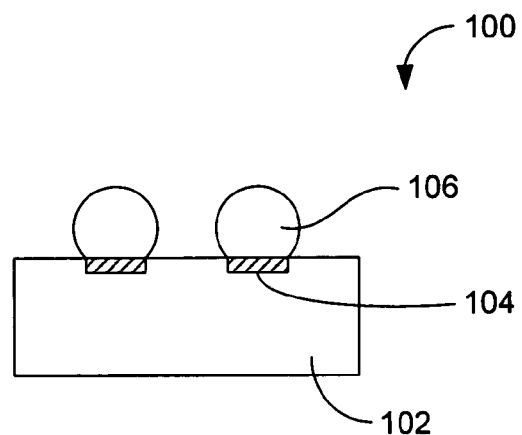
FIG. 1A is a diagrammatic side view of a conventional flip chip package.
Figure 1B:
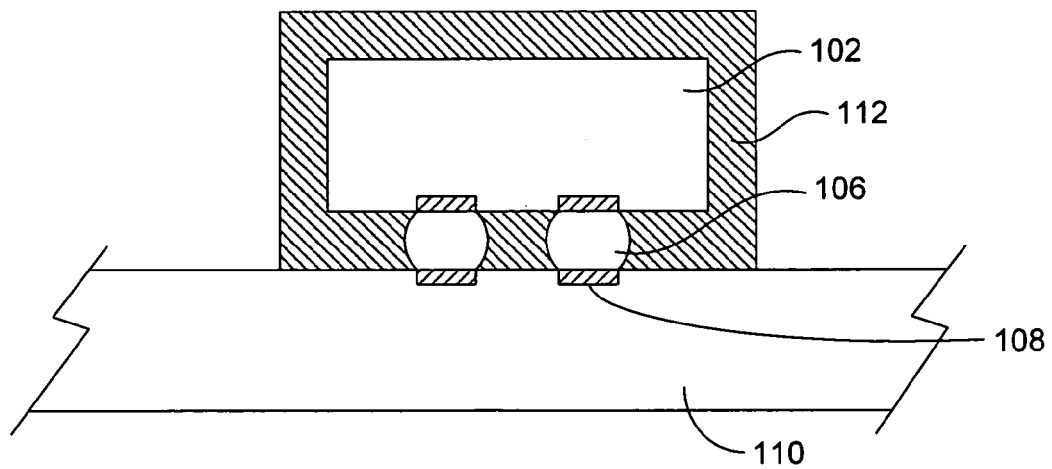
FIG. 1B is a diagrammatic side view of a conventional flip chip package attached to a substrate.
Figure 2:
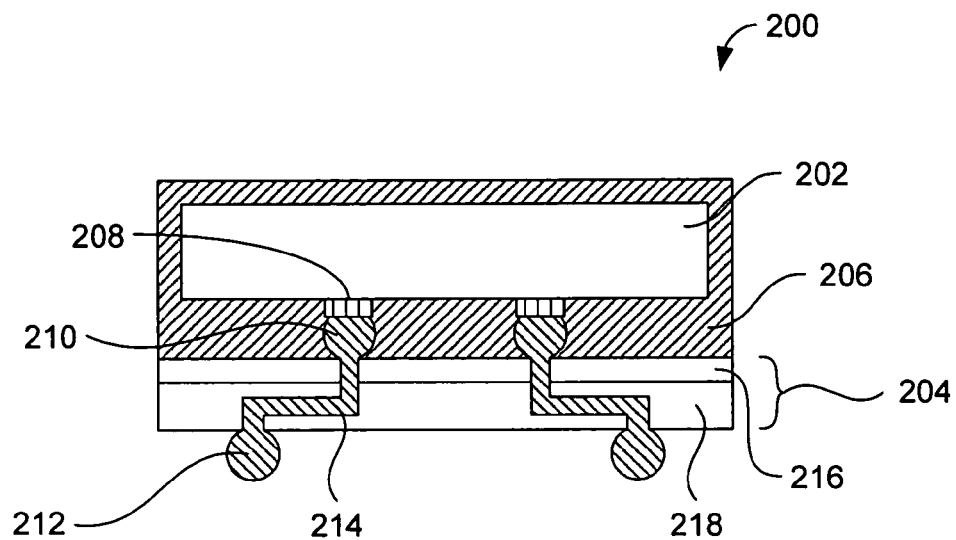
FIG. 2 is a diagrammatic side view of an example of a conventional semiconductor package utilizing an auxiliary wiring plate with external contacts formed on the wiring plate and resin interposed between the wiring plate and the die.
Figure 3:
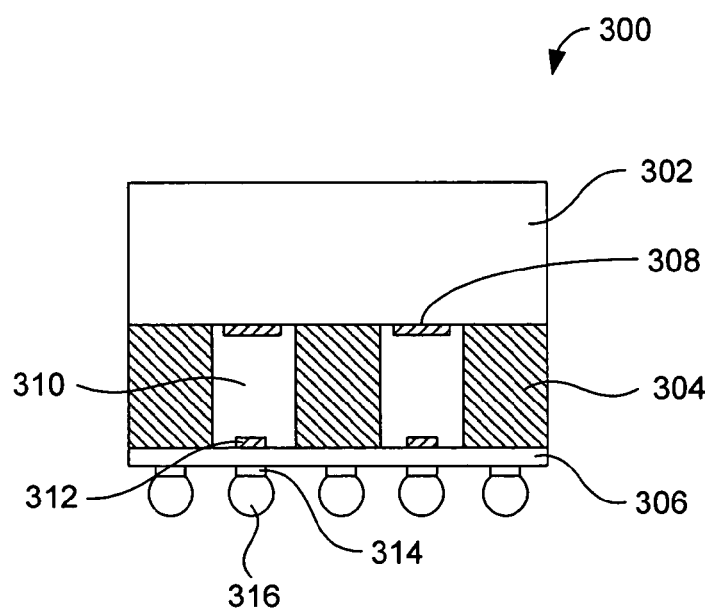
FIG. 3 is a diagrammatic side view of a conventional semiconductor package utilizing a compliant interposer layer and flexible wiring layer.
Figure 4:
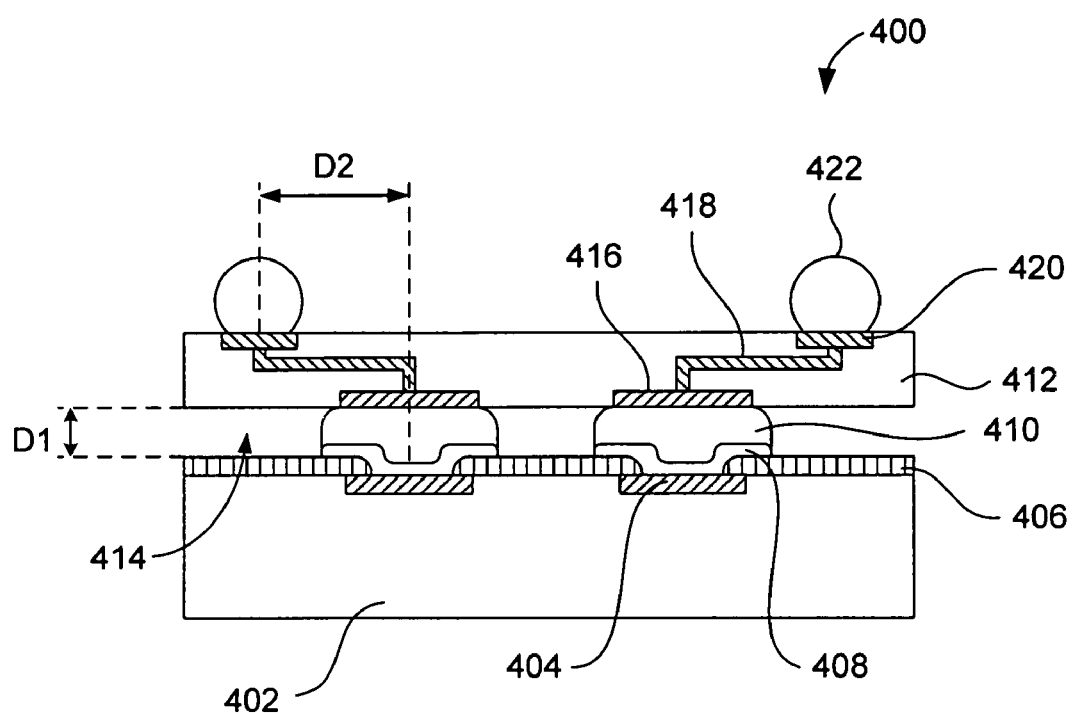
FIG. 4 is a diagrammatic side view illustration of a portion of a wafer level chip scale integrated circuit package in accordance with one embodiment of the present invention.

FIG. 4 is a diagrammatic side view illustration of a portion of a wafer level chip scale integrated circuit package 400 in accordance with one embodiment of the present invention. The package 400 includes an integrated circuit die 402 having a plurality of bond pads 404 formed on the top surface that provide external electrical contacts to various integrated circuit structures within the die. Typically, the top surface of the integrated circuit die 402 takes the form of a passivation layer 406 that has passivation vias, or openings, aligned over the bond pads 404. However, as will be appreciated by those skilled in the art, a wide variety of top surface arrangements may be provided on the die 402. Additionally, the die 402 may optionally include under bump pads 408 located over the bond pads 404 and conductively coupled with the bond pads 404. Raised interconnects 410 are located on the under bump pads 408 over the bond pads 404. Specifically, the bottom of the raised interconnect 410 is conductively attached with the surface of the under bump pad 408, and the top of the raised interconnect 410 extends vertically above the horizontal plane of the top surface of the die 402. In this way, the raised interconnects 410 are conductively coupled with the bond pads 404 through the under bump pads 408. It will be appreciated that in the absence of under bump pads, the raised interconnects 410 are formed on the bond pads 404.

A flexible circuit film 412 is located over and attached to the tops of the raised interconnects 410 and is substantially the same size as the die 402. The flexible circuit film 412 has a top surface and a bottom surface and is pre-fabricated to include routing conductors 418 that connect conductive inner landings 416 on the bottom surface of the flexible circuit film 412 with conductive outer landings 420 on the top surface of the flexible circuit film 412. The attachment of the flexible circuit film 412 to the tops of the raised interconnects 410 forms an air gap 414 having a height with a vertical distance, D1, between the top surface of the die 402 and the bottom surface of the flexible circuit film 412.

The flexible circuit film 412 is pre-fabricated such that the inner landings 416 on the bottom surface align with the corresponding raised interconnects 410 that are conductively coupled with the bond pads 404 on the die 402. Additionally, the outer landings 420 on the top surface are pre-fabricated a horizontal offset distance, D2, from the inner landings 416 on the bottom surface of the flexible circuit film 412 in a cantilever-like, or spring board structure. It should be noted that the offset distance does not have to be the same distance to each outer landing 420, and that several offset distances may be present within a package 400.

In the present illustration, the routing conductors 418 are shown encapsulated within the flexible circuit film 412; however, it will be appreciated that in other embodiments, the routing conductors 418 may also be formed on the bottom surface and/or top surface of the flexible circuit film 412. Further, the flexible circuit film 412, as shown, is a single layer material; however, it will be appreciated that in other embodiments, the flexible circuit film 412 may be multi-layered, or may be multi-layers of different materials.

Contact bumps 422, for example, solder bumps, are located on the outer landings 420 and are conductively attached to the outer landings 420. The contact bumps 422 are for use in connecting the package 400 to other substrates, such as a printed circuit board. Thus, when the package 400 is attached to another substrate, the connection at the contact bumps 422 is horizontally offset from the connection to the die 402 at the bond pads 404.

It will be appreciated that the package 400 of the present invention provides a highly compliant interconnection between the die 402 and another substrate. The combination of the offset contact structure on the flexible circuit film 412 and the air gap 414 formed between the die 402 and the flexible circuit film 412 absorbs stresses by allowing the contact bumps 422 on the flexible film 412 to move inward into the air gap 414 without damaging the die 402. In this way, the air gap 414 decouples some stresses that might otherwise be transferred in a rigid underfill layer or semi-rigid interposer layer located between the contact bumps 422 and the die 402.

Further, the use of the flexible circuit film 412 allows a variety of circuit patterns to be fabricated thereby reducing constraints on the location of the contact bumps 422. Thus, the present invention is not limited to packaging smaller die sizes/pin counts, such as 3×3 mm size/28–40 pin counts, and may be used with larger die sizes/pin counts as well.

While the above-described embodiment is illustrated such that the outer landings 420 are offset to fan out to the edges of the die 402, it will be appreciated that in other instances, it may be desirable that the offsets of the outer landings 420 be fanned in from the edges of the die 402, or may be directed at other angles relative to the edges of the die 402.

Figure 5:
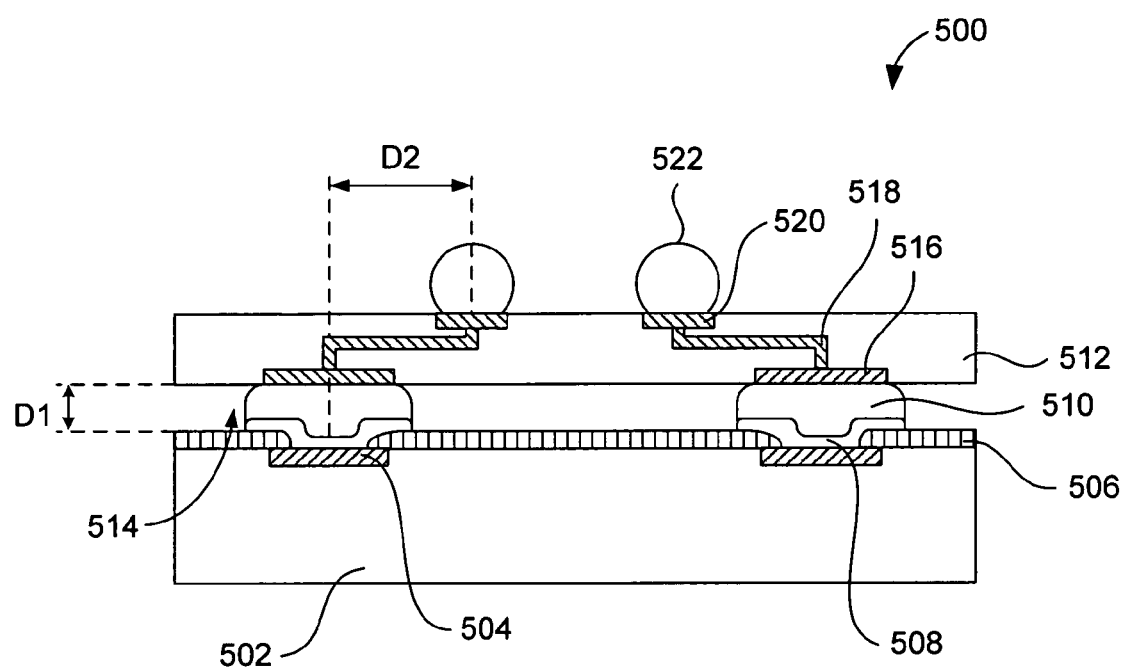
FIG. 5 is a diagrammatic side view illustration of a portion of a wafer level chip scale integrated circuit package in accordance with another embodiment of the present invention.

FIG. 5 is a diagrammatic side view illustration of a portion of a wafer level chip scale integrated circuit package in accordance with another embodiment of the present invention. In this embodiment, similar to the wafer level chip scale integrated circuit package 400 earlier described with reference to FIG. 4, the wafer level chip scale integrated circuit package 500 includes an integrated circuit die 502 having bond pads 504 formed on the top surface that may be coupled to the integrated circuit structures of the die 502. However, in this embodiment, the bond pads 504 are located at the edges of the die 502. As earlier described, typically, the top surface of the die 502 takes the form of a passivation layer 506 having passivation vias aligned over the bond pads 504. Additionally, the die 502 may optionally include under bump pads 508 formed over the bond pads 504 that are conductively coupled with the bond pads 504. The raised interconnects 510 are conductively coupled to the under bump pads 508 and the bond pads 504. As earlier described, in the absence of under bump pads, the raised interconnects 510 are formed on the bond pads 504.

As earlier described with reference to FIG. 4, the flexible circuit film 512 is located over and attached to the raised interconnects 510 and is substantially the same size as the die 502. The flexible circuit film 512 has a top surface and a bottom surface and is pre-fabricated to include routing conductors 518 that connect inner landings 516 on the bottom surface of the flexible circuit film 512 with outer landings 520 on the top surface of the flexible circuit film 512. The attachment of the flexible circuit film 512 to the tops of the raised interconnects 510 forms an air gap 514 having a height of vertical distance, D1, between the top surface of the die 502 and the bottom surface of the flexible circuit film 512. The flexible circuit film 512 is pre-fabricated such that the inner landings 516 on the bottom surface align with the corresponding raised interconnects 510 which are conductively coupled with the bond pads 504 on the die 502. In this embodiment, the outer landings 520 on the top surface are pre-fabricated a horizontal offset distance, D2, from the inner landings 516 on the bottom surface of the flexible circuit film 512 in a different way.

In this particular example, the offsets are directed internal to the location of the bond pads 504 relative to the edges of the die 502. As earlier noted with reference to FIG. 4, the offset distance does not have to be the same distance to each outer landing 520, and several offset distances may be present within a package 500.

Further, as previously described, the routing conductors 518 although shown formed within the flexible circuit film 512, may in other embodiments, be formed on the bottom surface and/or top surface of the flexible circuit film 512. Further, the flexible circuit film 512 may be a single layer material, as shown, or in other embodiments, may be multi-layered, or may be multi-layers of different materials. Contact bumps 522 located on and conductively attached to the outer landings 520 are for use in connecting the package 500 to other substrates.

It will be appreciated that when the wafer level chip scale package 500 of the present invention is attached to another substrate, such as a printed circuit board, it also provides a highly compliant interconnection between the package 500 and the board as earlier described with reference to FIG. 4.

It will be appreciated that although FIGS. 4 and 5 illustrate offsets, D2, in a fan out or fan in arrangement, other embodiments are possible. For example, both fan in and fan out arrangements may be used in the same package to increase the contact density. Additionally, offsets may be arranged at different angles from those illustrated to increase the contact density and/or to mitigate stresses associated with a particular die array of bond pads.

Figure 6:
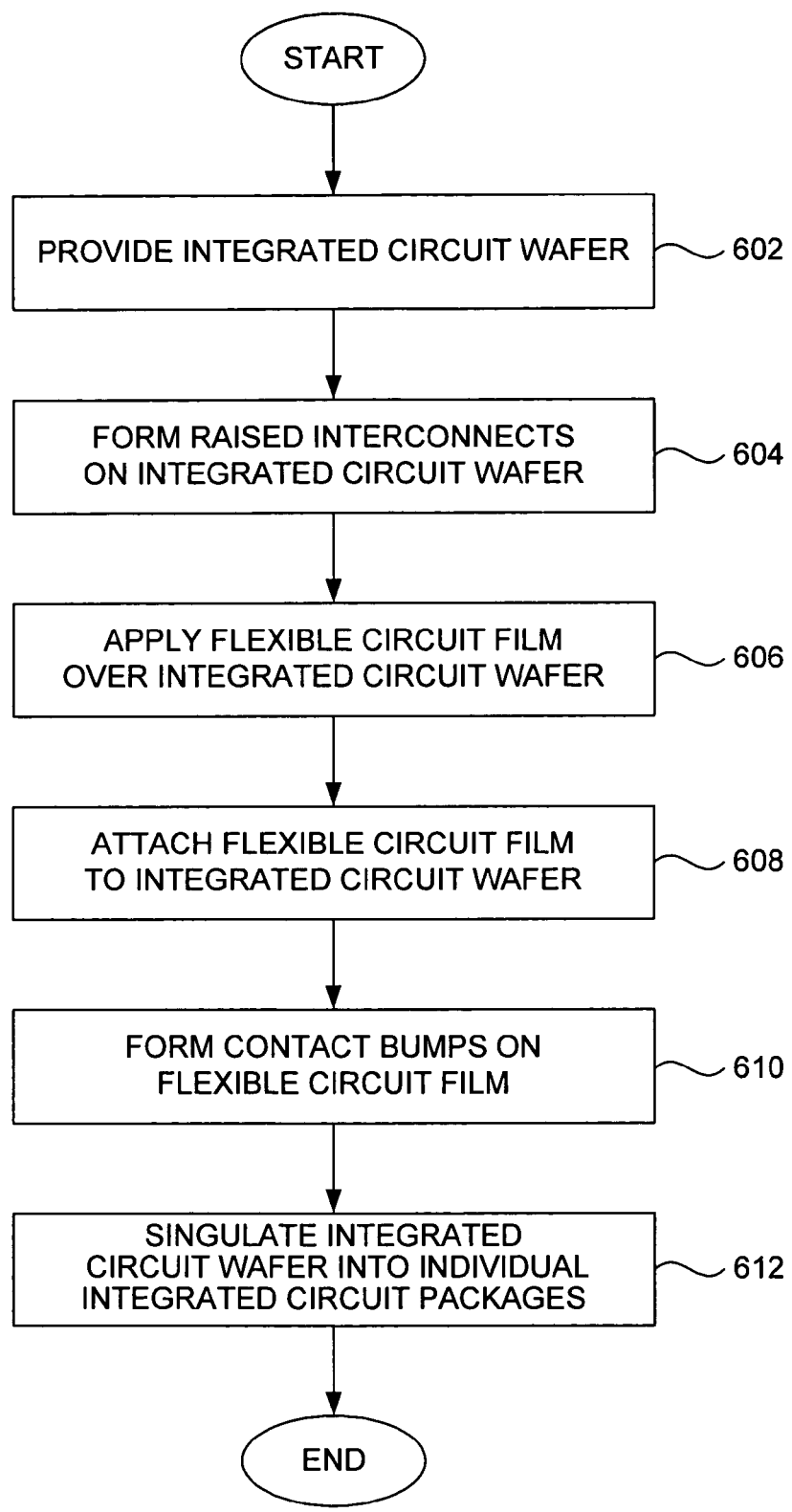
FIG. 6 is a flow chart illustrating a method for fabricating the wafer level chip scale integrated circuit package in accordance with one embodiment of the present invention.

FIG. 6 is a flow chart illustrating a method for fabricating the wafer level chip scale integrated circuit package in accordance with one embodiment of the present invention. Each of the operations described in the method 600 is further detailed in FIGS. 7A-7E.

FIGS. 7A-7E are diagrammatic side views of a portion of an integrated circuit wafer as it is fabricated into a wafer level chip scale integrated circuit package in accordance with the embodiment of the method illustrated in the flow chart of FIG. 6.

Figure 7A:
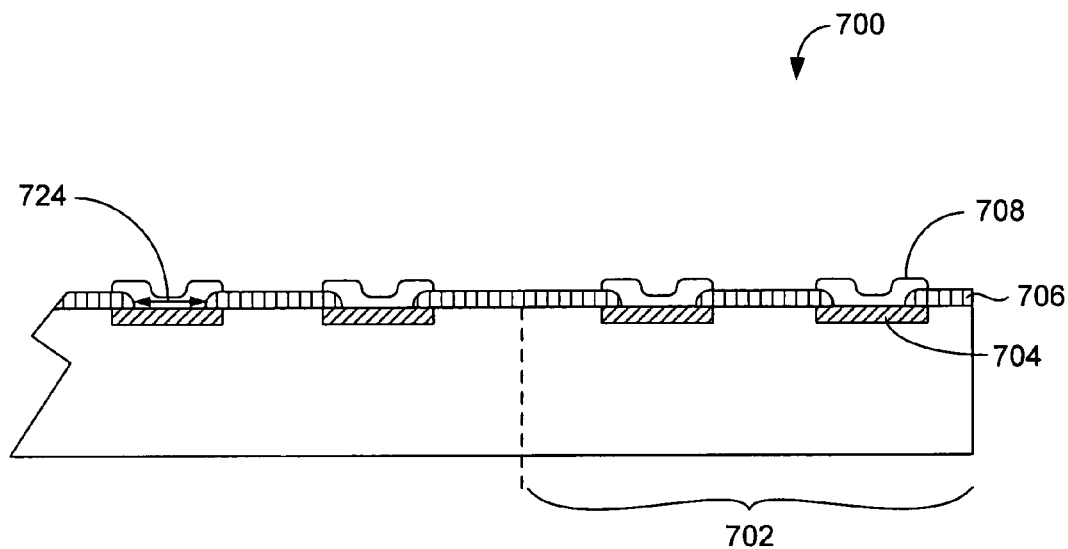
FIGS. 7A-7E are diagrammatic side views of a portion of an integrated circuit wafer as it is fabricated into a wafer level chip scale integrated circuit package in accordance with the embodiment of the method illustrated in the flow chart of FIG. 6.

Initially, an integrated circuit wafer 700 is provided in operation 602. As seen in FIG. 7A, the integrated circuit wafer 700 typically includes an array of integrated circuit dice 702. As earlier described, each die 702 on the wafer 700 may include a plurality of bond pads 704 on the top surface of the wafer 700 that connect to the integrated circuit structures of the die 702. The top surface of the wafer 700 typically takes the form of a passivation layer 706 having passivation vias 724 formed over the bond pads 704. The bond pads 704 may optionally include under bump pads 708 formed over and conductively coupled to the bond pads 704.

The under bump pads 708 may be formed from any suitably conductive and solder wettable material. For example, under bump pads 708 may be formed using a conventional sputtering technique in which a thin under bump layer of metal, such as aluminum with NiV, is deposited over the passivation layer 706 and into the passivation vias 724. Using conventional process techniques, portions of the sputtered under bump layer on the top surface of the passivation layer are removed, leaving the under bump pad 708 formed on the bond pad 704. The under bump pad 708 may extend over the edges of the passivation vias 724 and onto a portion of the top surface of the passivation layer 706. Although under bump pad formation may be widely varied, by way of example, the under bump pad 708 may have a thickness within the range of between about 10,000 angstroms and 30,000 angstroms, as for example, about 22,000 angstroms. Further descriptions of under bump metallization techniques may be found described in commonly assigned U.S. patent application Ser. No. 09/031,167, filed Feb. 26, 1998, entitled "Surface Mount Die: Wafer Level Chip-Scale Package and Process for Making the Same," by Schaefer et al., and which is incorporated herein by reference.

Figure 7B:
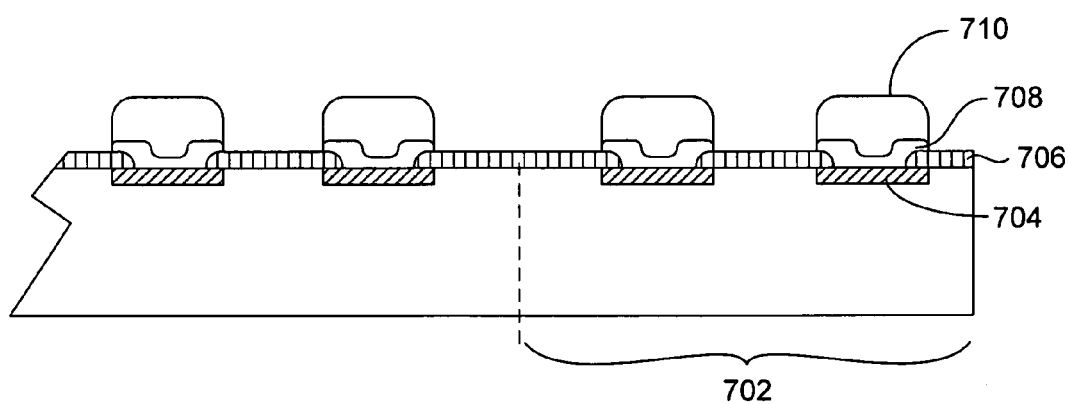

In operation 604, raised interconnects 710 are formed on the wafer 700. As shown in FIG. 7B, after formation of the under bump pads 708, individual raised interconnects 710 are formed over corresponding under bump pads 708. In one example, the raised interconnects 710 may be formed using conventional solder bumping or balling techniques. As earlier described, in the absence of under bump pads, the raised interconnects are formed on the bond pads 704.

Of particular note in the formation of the raised interconnects 710 is the height of the raised interconnects 710. The height of the raised interconnects 710 above the horizontal plane of the surface of the passivation layer 706 of the wafer 700 determines the height of the later formed air gap, i.e., the vertical distance, D1. The height of the raised interconnects 710 may be widely varied and is chosen to arrive at the desired air gap height. By way of example, heights in the range of between about 10 μm to 500 μm, as for example, 100 μm, have been found to work well.

Figure 7C:
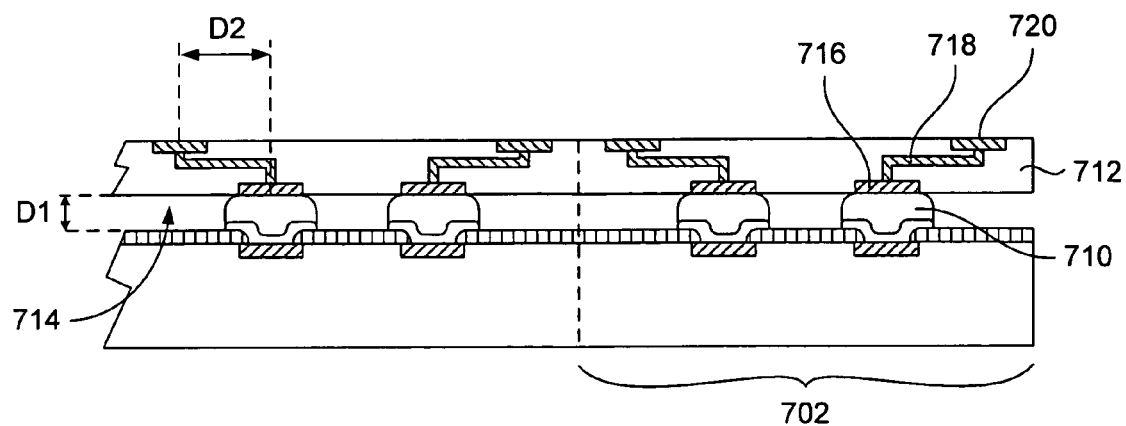

The flexible circuit film 712 is applied to the integrated circuit wafer 700 in operation 606. As shown in FIG. 7C, the flexible circuit film 712 is applied over and attached to the tops of the raised interconnects 710, e.g., the top of the raised interconnect 710 being opposite the end of the raised interconnect 710 that is formed over and attached to the under bump pad 708, or the bond pad 704 if under bump pads are not used. In one embodiment, the flexible circuit film 712 has a bottom surface and a top surface and is conductively patterned with routing conductors 718 that connect inner landings 716 on the bottom surface with outer landings 720 on the top surface. In one embodiment, the flexible circuit film 712 is pre-patterned such that, when the flexible circuit film 712 is attached to the raised interconnects 710, the inner landings 716 align with the raised interconnects 710, and the outer landings 720 are horizontally offset from the inner landings 716 a distance, D2.

In one embodiment, the horizontal offset distance may be measured from the center of an inner landing 716 to the center of an associated outer landing 720. However, it will be appreciated that other measures of the offset distance may be used. For example, the offset distance may be measured from the edge of an inner landing 716 to the edge of an associated outer landing 720. The horizontal offset distance may vary widely. By way of example, the offset distance may be in the range of between and including about 50 μm to 1,000 μm, as for example, 250 μm. Further, as earlier described, a variety of offset distances may be used within the same integrated circuit package.

As shown, the routing conductors 718 are encapsulated within the flexible circuit film 712. However, it will be appreciated that in other embodiments, the routing conductors 718 may be patterned on the bottom surface and/or the top surface of the flexible circuit film 712. Further, the flexible circuit film 712, as shown, is a single layer material; however, it will be appreciated that in other embodiments, the flexible circuit film 712 may be multi-layered, or may be multi-layers of different materials. In one embodiment, the flexible circuit film 712 may be a pre-patterned polyimide film or benzocyclobutene (BCB) substrate. The thickness of the flexible circuit film 712 may be widely varied. By way of example, thicknesses on the order of about 10,000 angstroms to 200,000 angstroms, as for example, 30,000 angstroms, have been found to work well, although other thicknesses may also be appropriate.

In one embodiment, the flexible circuit film 712 may be pre-fabricated substantially the same size as the integrated circuit wafer 700 and may have positioning marks that allow alignment during processing of the integrated circuit wafer 700, as well as scribe lines for use in singulation. In other embodiments, the flexible circuit film 712 may be formed larger than the wafer 700 or may be differently sized and/or marked, so long as the proper placement and attachments can be made as described above. For example, the flexible circuit film 712 may be pre-fabricated in a square shape that is larger than the wafer 700 with the patterning of a portion of the flexible circuit film 712 pre-fabricated to correspond with the wafer 700.

In operation 608, the flexible circuit film 712 is attached to the integrated circuit wafer 700. As further shown in FIG. 7C, the inner landings 716 of the flexible circuit film 712 are attached to the corresponding raised interconnects 710. The attachment of the flexible circuit film 712 to the tops of the raised interconnects 710 creates an air gap 714 having a height of vertical distance, D1, between the wafer 700 and the flexible circuit film 712. The height of the air gap 714 may be widely varied. By way of example, the height may be in the range of between about 10 µm to 500 µm. The inner landings 716 may be attached to the raised interconnects 710 utilizing standard reflow techniques that create a conductive attachment and/or other thermo-mechanical or thermo-sonic attachment techniques.

Figure 7D:
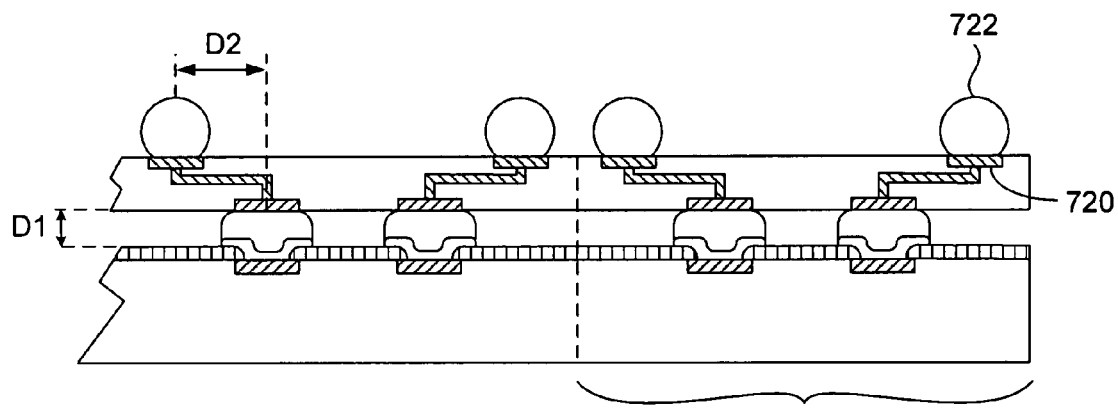

In operation 610, contact bumps 722 are formed on the flexible circuit film 712. As shown in FIG. 7D, contact bumps 722 are formed over the outer landings 720 located on the top surface of the flexible circuit film 712. The contact bumps 722 may be formed using conventional solder bumping or balling techniques.

As earlier noted, the outer landings 720 on the top surface of the flexible circuit film 712 are pre-fabricated so that the outer landings 720 are offset a distance, D2, from the location of the inner landings 716 on the bottom surface of the flexible circuit film 712. As the inner landings 716 are attached to corresponding raised interconnects 710 formed on under bump layers 708 over bond pads 704 on the surface of the wafer 700, the result is that the contact bumps 722 are offset in a cantilevered-like arrangement on the flexible circuit film 712 from the connections to the die 702 at the bond pads 704. This offset of the contact bumps 722 allows stresses placed on the contact bumps 722 to be mitigated and decoupled from the die 702 by permitting the cantilevered contact bump 722 to move on the flexible circuit film 712 over the air gap 714.

Figure 7E:
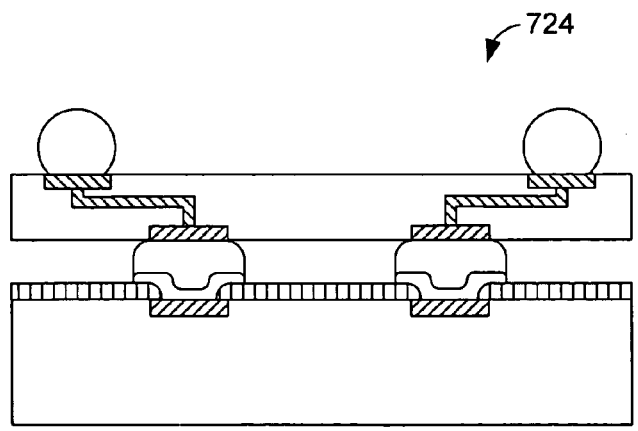

In operation 612, the wafer 700 is singulated. As shown in FIG. 7E, following formation of the contact bumps 722, the integrated circuit wafer 700 is singulated into individual wafer level chip scale integrated circuit packages 724. The integrated circuit wafer 700 may be singulated using any conventional technique, such as laser cutting, or sawing.

Optionally, prior to singulation, in another embodiment, the bottom surface of the wafer 700 may be thinned to reduce the thickness of the packages prior to singulation. Thinning the wafer 700 introduces more compliancy into the later formed wafer level chip scale packages 724 and may provide some further mitigation of stresses received by the packages 724 when attached to another substrate. The thinning may be accomplished using conventional wafer thinning techniques, such as grinding.

Following singulation, the individual wafer level chip scale packages 724 are then ready for packaging or for attachment to other substrates, such as printed circuit boards.

As will be appreciated, the present invention provides for wafer level fabrication of thousands of integrated circuit packages. To illustrate this more clearly, various aspects of the present invention are described from a wafer level view.

Figure 8A:
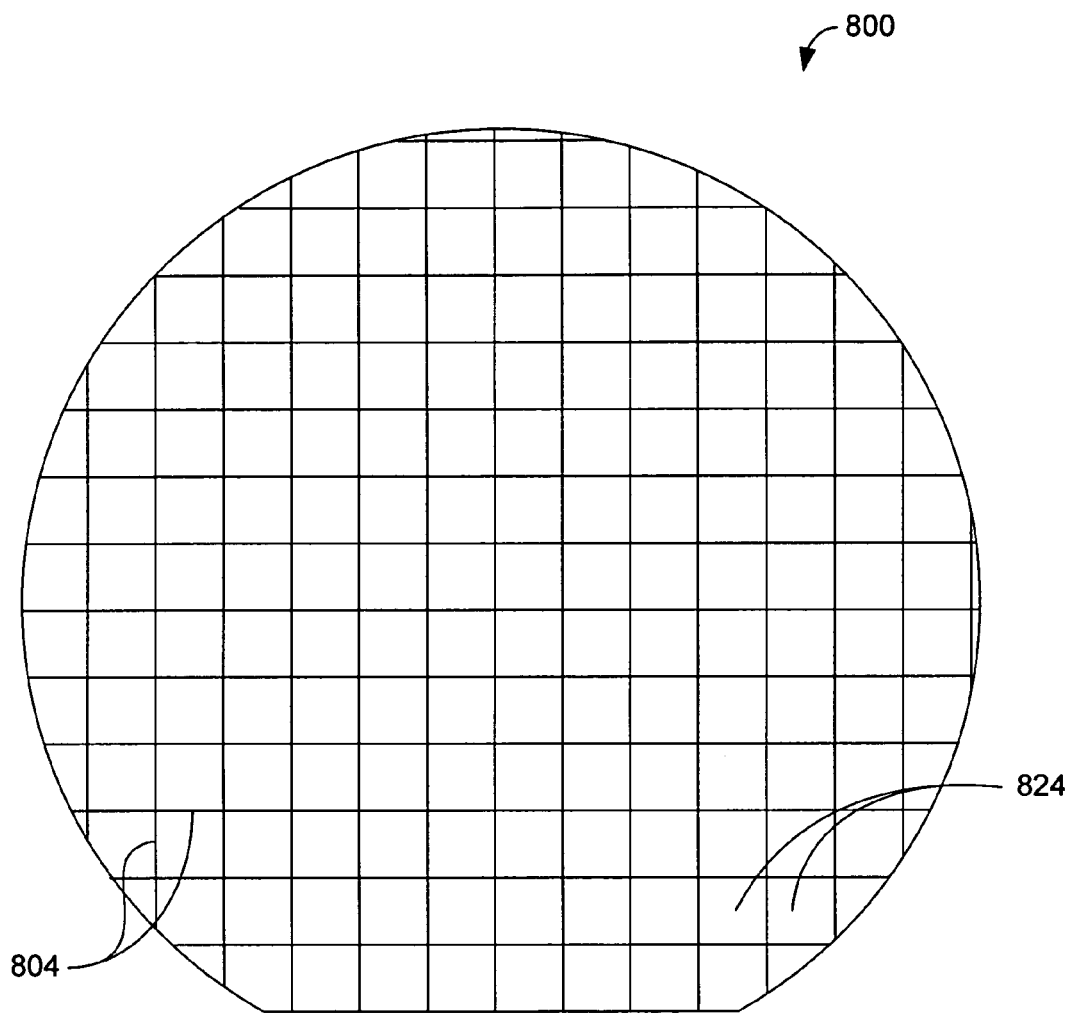
FIG. 8A is a diagrammatic top view of a wafer that includes a plurality of the wafer level chip scale integrated circuit packages in accordance with one embodiment of the present invention.

FIG. 8A is a diagrammatic top view of a wafer that includes a plurality of the wafer level chip scale integrated circuit packages in accordance with one embodiment of the present invention. In the illustration, the wafer 800 is not drawn to scale and the wafer 800 may include thousands, tens of thousands, or more integrated circuit packages 802. Typically, scribe lines 804 are positioned between each package 802. These scribe lines 804 are preferably present on the flexible circuit film as well as the wafer 800. When the wafer 800 is singulated, or diced, the dicing tool cuts along the scribe lines 804.

Additionally, a protective film (not shown) may be deposited over the bottom surface of the wafer 800 to aid in reducing chipping during the wafer singulation process. Preferably, the protective film is in the form of a thick film and is formed by any suitable process for applying a thick film, for example, a screen printing process. In another example, a spinning type process may be used, so that a thick film is spread across the bottom surface of the wafer. Several embodiments of methods for forming a protective thick film on the bottom surface of the wafer are described in commonly assigned U.S. patent application Ser. No. 09/006,759, filed Jan. 14, 1998, entitled, "Semiconductor Wafer Having a Bottom Surface Protective Coating," by Kao et al., and in commonly assigned U.S. patent application Ser. No. 09/391,854, filed Sep. 8, 1999, entitled "Semiconductor Wafer Having a Bottom Surface Protective Coating" by Kao et al., which is incorporated herein by reference.

Figure 8B:
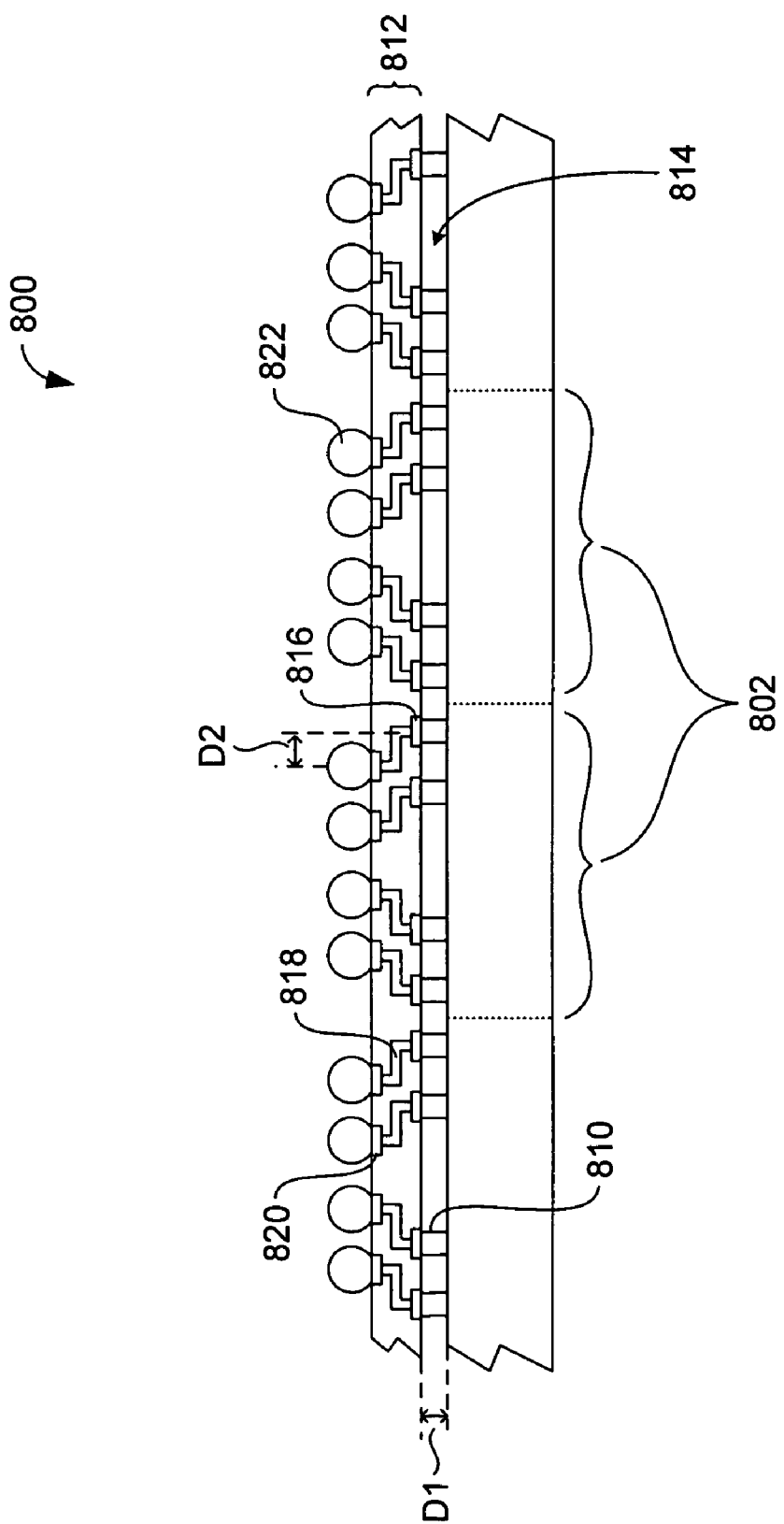
FIG. 8B is a diagrammatic side view of a portion of the wafer of FIG. 8A that includes a plurality of wafer level chip scale integrated circuit packages in accordance with one embodiment of the present invention.

FIG. 8B is a diagrammatic side view of a portion of the wafer of FIG. 8A that includes a plurality of wafer level chip scale integrated circuit packages in accordance with one embodiment of the present invention. Prior to singulation, the wafer 800 includes the flexible circuit film 812 attached to the raised interconnects 810 at the inner landings 816 forming the air gap 814, having a height of a vertical distance, D1. The contact bumps 822 are attached to the outer landings 820 that are offset from the inner landings 816. As earlier described, the inner landings 816 are conductively coupled with the outer landings 820 through routing conductors 818; thus, the contact bumps 822 are conductively coupled to the die 802 through a highly compliant connection.

ALTERNATIVE EMBODIMENTS

As earlier described with reference to FIG. 7C, one embodiment of the present invention utilizes a flexible circuit film that is pre-patterned with inner landings interconnected to outer landings, and, then contact bumps are applied to the outer landings as part of the fabrication process of the wafer level chip scale package. In another embodiment of the present invention, the flexible circuit film may be provided with the contact bumps pre-attached to the outer landings. In this alternative embodiment, the operation involving application of the contact bumps to the outer landings, for example, operation 610 of FIG. 6, is not performed, as the contact bumps are already pre-fabricated on the flexible circuit film. Thus, in this alternative embodiment, singulation of the integrated circuit wafer may be performed following attachment of the flexible circuit film to the raised interconnects assuming the optional thinning of the wafer is not performed.

In other situations, it may be desirable to not apply a separate contact bump over the outer landings. Thus, in a further embodiment, the contact bumps may be omitted entirely.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. A method for fabricating an integrated circuit package comprising:
   providing an integrated circuit wafer, said integrated circuit wafer including a plurality of individual integrated circuit dice, said integrated circuit wafer further having a top surface including a plurality of bond pads which connect to said individual integrated circuit dice and a bottom surface opposite said top surface;
   forming raised interconnects over and conductively coupled to said bond pads;
   applying a flexible circuit film over said raised interconnects;
   conductively attaching said flexible circuit film to said raised interconnects such that an air gap is formed between said flexible circuit film and said integrated circuit wafer; and
   singulating said integrated circuit wafer into individual integrated circuit packages.

2. The method of claim 1 wherein said air gap has a height in the range of between about 10 µm to 500 µm.

3. The method of claim 1 wherein said flexible circuit film has a bottom surface and a top surface, and further comprises inner landings formed on said bottom surface interconnected to outer landings formed on said top surface, and wherein said flexible circuit film is attached to said raised interconnects at said inner landings.

4. The method of claim 3 wherein said outer landings are offset a horizontal distance from said inner landings, and further wherein said horizontal distance in the range of between about 50 µm to 1,000 µm.

5. The method of claim 3 further comprising:
   forming contact bumps on said outer landings of said flexible circuit film; and,
   conductively attaching said contact bumps to said outer landings.

6. The method of claim 3 wherein said flexible circuit film further comprises contact bumps formed on and conductively attached to said outer landings.

7. The method of claim 1 wherein said integrated circuit wafer further comprises under bump pads formed over said bond pads, said under bump pads being conductively coupled between a bond pad and an associated raised interconnect.

8. The method of claim 1 wherein the flexible circuit film is made up of multiple layers.

9. The method of claim 8 wherein the flexible circuit film contains at least one outer landing connected to at least one inner landing via a routing connector in such a way as to form a cantilever-like structure.

10. The method of claim 9 wherein the routing conductor is integrally incorporated into the flexible circuit film such that it is embedded in a dielectric material.

11. The method of claim 9 wherein the routing conductor is integrally incorporated into the flexible circuit film and is formed on one of the top and bottom surfaces of a dielectric material.

12. The method of claim 11 wherein a portion of the routing conductor extends laterally within the flexible circuit film.

13. The method of claim 1, wherein the flexible circuit film includes a base formed of a dielectric material.

14. The method of claim 1, wherein the air gap between the integrated circuit die and associated flexible circuit film remains after the wafer and flexible circuit film have been singulated into individual integrated circuit packages.

15. A wafer level method for fabricating integrated circuit packages comprising:
   providing an integrated circuit wafer, said integrated circuit wafer including a plurality of individual integrated circuit dice, said integrated circuit wafer further having an active surface including a plurality of bond pads and a bottom surface opposite said active surface;
   forming raised interconnects over and conductively coupled to said bond pads;
   applying a flexible circuit film over said raised interconnects;
   conductively attaching said flexible circuit film to said raised interconnects such that an air gap is formed between said flexible circuit film and said integrated circuit wafer; and
   singulating said integrated circuit wafer and said flexible circuit film into individual integrated circuit packages after conductively attaching said flexible circuit film to said raised interconnects, wherein air gaps remain between the integrated circuit dice and associated integrated circuit films after the wafer and flexible circuit film have been singulated into individual integrated circuit packages.

* * * * *